United States Patent [19]
Haider et al.

[11] Patent Number: 6,075,379
[45] Date of Patent: Jun. 13, 2000

[54] SLEW RATE CONTROL CIRCUIT

[75] Inventors: Nazar S. Haider, Fremont; Srinivasan Rajagopalan, San Jose; Cau L. Nguyen, Fremont, all of Calif.

[73] Assignee: Intel Corporation, Santa Clara, Calif.

[21] Appl. No.: 09/012,120

[22] Filed: Jan. 22, 1998

[51] Int. Cl.[7] .................. H03K 17/16; H03K 19/003; H03K 5/12

[52] U.S. Cl. ................ 326/21; 326/27; 326/83; 326/29; 327/170

[58] Field of Search .................. 326/21, 17, 29, 326/30, 82, 83, 86, 27, 85, 32; 327/170

[56] References Cited

U.S. PATENT DOCUMENTS

| | | | |
|---|---|---|---|
| 5,118,971 | 6/1992 | Schenck | 326/32 |
| 5,134,311 | 7/1992 | Biber et al. | 326/30 |
| 5,162,672 | 11/1992 | McMahan et al. | 326/86 |
| 5,254,883 | 10/1993 | Horowitz et al. | 326/30 |
| 5,537,070 | 7/1996 | Risinger | 327/170 |
| 5,568,081 | 10/1996 | Lui et al. | 327/380 |
| 5,781,050 | 7/1998 | Russell | 327/170 |
| 5,926,032 | 7/1999 | Gebara et al. | 326/30 |

OTHER PUBLICATIONS

T. Gabara, D. Thompson, *Ground Bounce Control In CMOS Integrated Circuits*, Session VIII, 1988 IEEE International Solid–State Circuits Conference, ISSCC 88, Feb. 17, 1988, pp. 88–89 and 313.

T. Gabara, W. Fischer, J. Harrington, W. Troutman, *Forming Damped LRC Parasitic Circuits In Simultaneously Switched CMOS Output Buffers*, IEEE Journal Of Solid–State Circuits, vol. 32, No. 3, Mar. 1997, pp. 407–417.

*Primary Examiner*—Michael Tokar
*Assistant Examiner*—Daniel D. Chang
*Attorney, Agent, or Firm*—Howard A. Skaist

[57] ABSTRACT

Briefly, in accordance with one embodiment of the invention, a slew rate control circuit for a processor includes: a circuit configuration to produce a signal representing the speed of fabricated transistors; and a circuit configuration to adjust, based at least in part on the signal representing the speed of fabricated transistors, the amount of current produced by a pre-driver stage for an output buffer of the processor. Briefly, in accordance with another embodiment of the invention, an integrated circuit includes: a slew rate control circuit for a buffer including: a register capable of storing at least one binary digital signal, a pre-driver, and at least one pre-driver cell coupled to the pre-driver. The at least one pre-driver cell is coupled to the pre-driver and register so as to modify the amount of current produced by the pre-driver based, at least in part, on the at least one binary digital signal.

21 Claims, 4 Drawing Sheets

SLEW RATE CONTROL CIRCUIT

BACKGROUND

1. Field

The present invention relates to the slew rate of a binary digital signal, and, more particularly, to a method or technique for adjusting or controlling this slew rate.

2. Background Information

As is well-known, speeds at which processors, such as microprocessors, execute instructions has been increasing dramatically. As is also well-known, when transistors are fabricated for such a processor or microprocessor, the effective length of the transistor channel may vary due to slight variations in the process, such as temperature and the like. As processor speeds increase, the effect that these variations in the channel length have upon processor performance becomes of greater significance. For example, the slew rate of binary digital signals produced by the processor may be affected by these variations. A need, therefore, exists for a method or technique of controlling slew rate, despite these variations in transistor channel length.

SUMMARY

Briefly, in accordance with one embodiment of the invention, a slew rate control circuit for a processor includes: a circuit configuration to produce a signal representing the speed of fabricated transistors; and a circuit configuration to adjust, based at least in part on the signal representing the speed of fabricated transistors, the amount of current produced by a pre-driver stage for an output buffer of the processor.

Briefly, in accordance with another embodiment of the invention, an integrated circuit includes: a slew rate control circuit for a buffer including: a register capable of storing at least one binary digital signal, a pre-driver, and at least one pre-driver cell coupled to the pre-driver. The at least one pre-driver cell is coupled to the pre-driver and register so as to modify the amount of current produced by the pre-driver based, at least in part, on the at least one binary digital signal.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawing in which:

DETAILED DESCRIPTION

In the following detailed description, specific details are set forth in order to provide a thorough understanding of the invention. However, it will be understood by those skilled in the relevant art that the present invention may be practiced without these specific details. In other instances, well-known methods, procedures, components, and circuits have not been described in detail so as not to obscure the present invention.

As previously described, the execution speeds of processors, such as microprocessors, have increased significantly. The effective length of a transistor channel, which may vary depending upon the process employed, temperature, and other variables, may affect the slew rate of digital output signals produced by an integrated circuit, for example. Therefore, although the invention is not restricted in scope to being employed only in connection with processors or microprocessors, the slew rate may become a performance factor due, at least in part, to high execution speeds.

Figure 3:
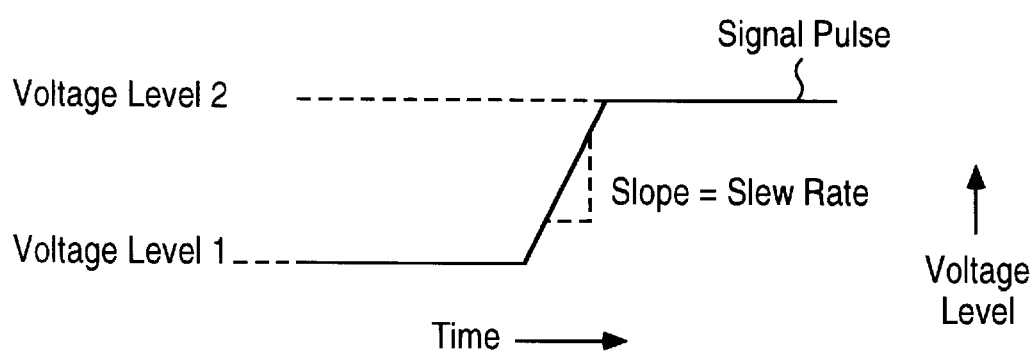
FIG. 3 is a plot illustrating the slew rate of a digital output signal.

In one embodiment or application of a slew rate control circuit in accordance with the present invention, a GTL (Gunning Transceiver Logic) or GTL+ (Gunning Transceiver Logic Plus) buffer, such as described in Pentium® Pro Family Developer's Manual, Volume 1; Specification (order no. 242690-001), available from Intel Corp., 1996, that produces output signals, referred to in this context as binary digital signals, may employ slew rate control to affect performance. In this context, the term binary digital signal or bit refers to a voltage signal having two voltage levels with the particular voltage levels corresponding to one of either a logical one or a logical zero signal, such as a five volt level signal and ground level signal, for example. When such a binary digital signal transitions from one voltage signal level to another, the slope of the voltage signal during the transition is referred to as slew rate and is typically proportional with the speed of the device. Slew rate is illustrated in the diagram of FIG. 3 and is typically specified in volts per nanosecond.

As previously discussed, the effective length of the channel of a transistor may vary due to a variety of factors. Likewise, because the length of the channel affects the speed of the transistor, the variation in effective channel length is directly related to the performance/speed of the processor under fixed environmental conditions. In this context, the effective transistor channel length is referred to as "LE" (Length Effective). Thus, although the transistors to be fabricated for a given integrated circuit are targeted to have a particular LE, typically the fabricated transistors are faster or slower than intended due to variations in the effective channel length of the transistor from the targeted LE.

For the input and output buffers for a processor, such as a microprocessor, for example, due to the relatively rapid execution times capable of being produced, a relatively "tight" specification window is employed for the minimum valid time ($T_{comin}$) and maximum valid time ($T_{comax}$) for a signal port. In this context, this refers to, respectively, the smallest amount of time that must elapse or pass before the data signal available from a signal port is "valid," measured with respect to an edge of a pulse of a system clock signal, and the longest amount of time to elapse after which the data signal available from the signal port, measured with respect to the same system clock signal pulse edge, is valid. These values are typically related to the overall system performance and, therefore, the faster the processor, typically the tighter these values are specified. Likewise, a tight slew rate window also typically is specified. Unfortunately, the $T_{comin}$, $T_{comax}$ and slew rate produced by a given port for a given manufactured IC (Integrated Circuit), such as a processor, for example, may vary with LE for the associated transistors.

This may occur because, as previously indicated, the speed of the transistors may vary considerably, depending, at least in part, on the deviation from a target LE. Therefore, it may be desirable in some environments to be able to adjust the slew rate of a buffer, such as an output buffer, for example, based, at least in part, on the speed of the transistors, at least to limit or reduce the noise in the overall system.

One way to adjust or control the slew rate is to adjust current based at least in part on the speed of the fabricated transistors. For example, in one embodiment, this control may be accomplished by a pre-driver stage or pre-driver circuitry, such as may be used in conjunction with a buffer, so that the pre-driver stage does not provide as much drive current if the transistors are too fast and provides excess current if the transistors are too slow, although the invention is not limited in scope in this respect. Such pre-driver circuitry may also be used in conjunction with a buffer on a processor, such as a microprocessor. Of course, the invention is not limited in scope to this embodiment. Alternatively, instead of adjusting the current, the resistance of the driving transistor may be adjusted to affect the slew rate. Likewise, the resistance and current may both be adjusted.

Figure 1:
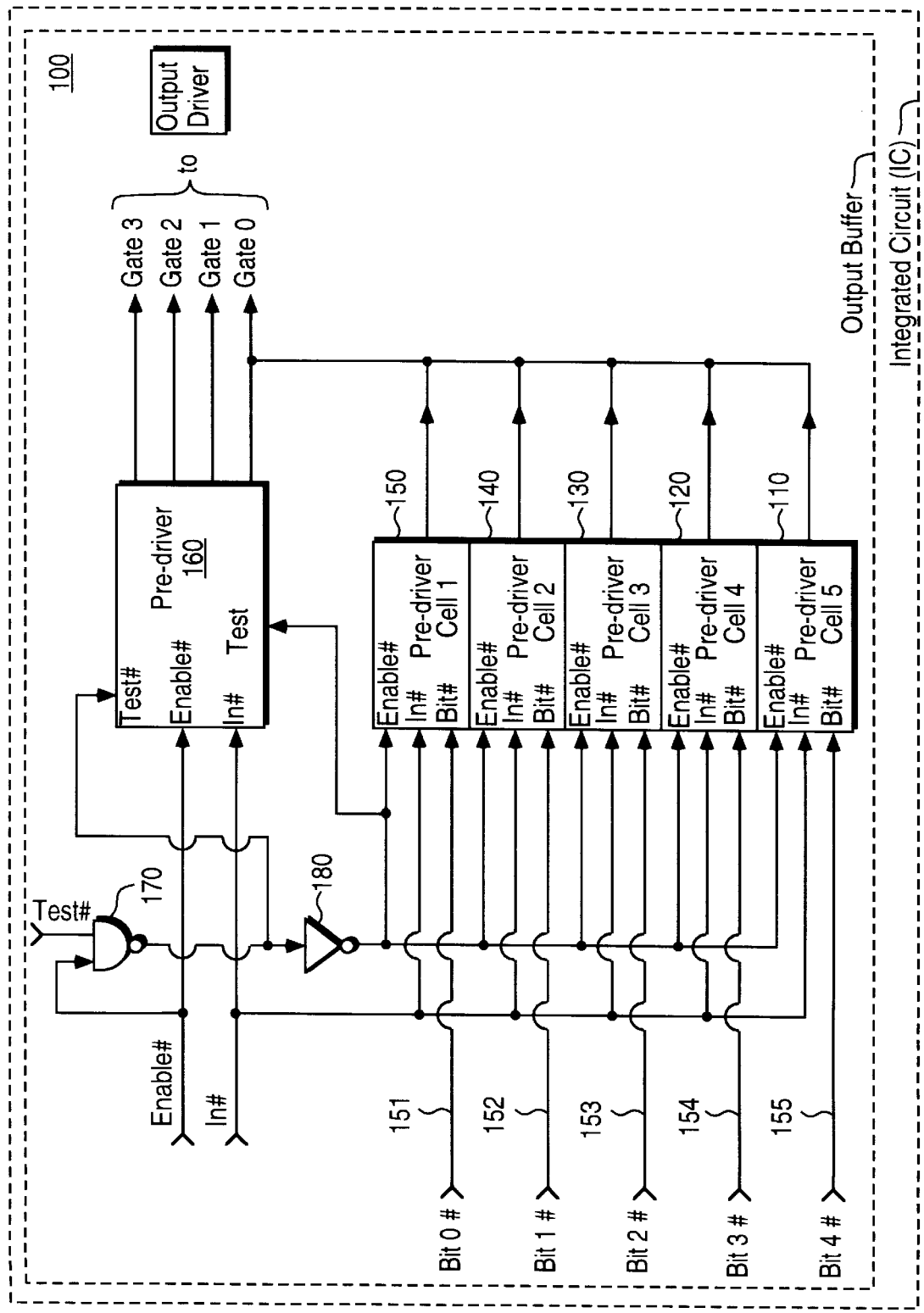
FIG. 1 is a block diagram illustrating an embodiment of a slew rate control circuit in accordance with the invention.

FIG. 1 is a block diagram illustrating an embodiment 100 of a slew rate control circuit in accordance with the present invention. This particular embodiment is illustrated in conjunction with a pre-driver 160 coupling to a gate, such as gate 0, of an output driver for an output buffer; although, as previously indicated, the invention is not restricted in scope to an output buffer. Coupled to pre-driver 160 in this embodiment is a plurality of pre-driver cells, 110, 120, 130, 140, and 150. Of course, alternatively, only a single pre-driver cell, at least one pre-driver cell, or more pre-driver cells may be coupled to a pre-driver, such as 160. In this context, the term pre-driver refers to a circuit prior to the final or output driver, including a circuit not immediately prior, in the data path, that has the capability to affect $T_{comin}$ and/or $T_{comax}$. The pre-driver and pre-driver cells in this particular embodiment form a pre-driver stage. The plurality of cells are each in this embodiment coupled by bit lines to a register capable of storing a plurality of binary digital signals. In this context, the term register refers to one or more sequential elements coupled in a chain or series. The term sequential element refers to a component of a circuit controlled by a clock signal, such as a latch or flip-flop, for example. In this embodiment, each cell is coupled to a separate sequential element of the register (see FIG. 4, for example). This is illustrated in FIG. 1 by bit lines 151, 152, 153, 154, and 155. As further illustrated in FIG. 1, the output port of each cell in this particular embodiment is coupled to a gate of the driver, such as gate 0, along with an output port of pre-driver 160. FIG. 1 illustrates the output ports of pre-driver 160 coupling to four gates. Although the invention is not limited in scope in this respect, pre-driver 160 employs GTL phase control. Therefore, many transistors are employed as the output driver and the transistors are activated at different phases using pass gates to provide delay between activation. For example, if ten transistors are employed to drive the output signal as the output driver, then in this particular embodiment gate 0 is coupled to the majority of these transistors. The gates 0–3 are also coupled to selected transistors of the ten to provide the desired phase control. As shall be explained in more detail hereinafter, in this embodiment, each pre-driver cell is coupled to pre-driver 160 and to a sequential cell of the register to adjust or modify the current supplied by the pre-driver based, at least in part, on a plurality of binary digital signals capable of being stored in the register.

Figure 4:
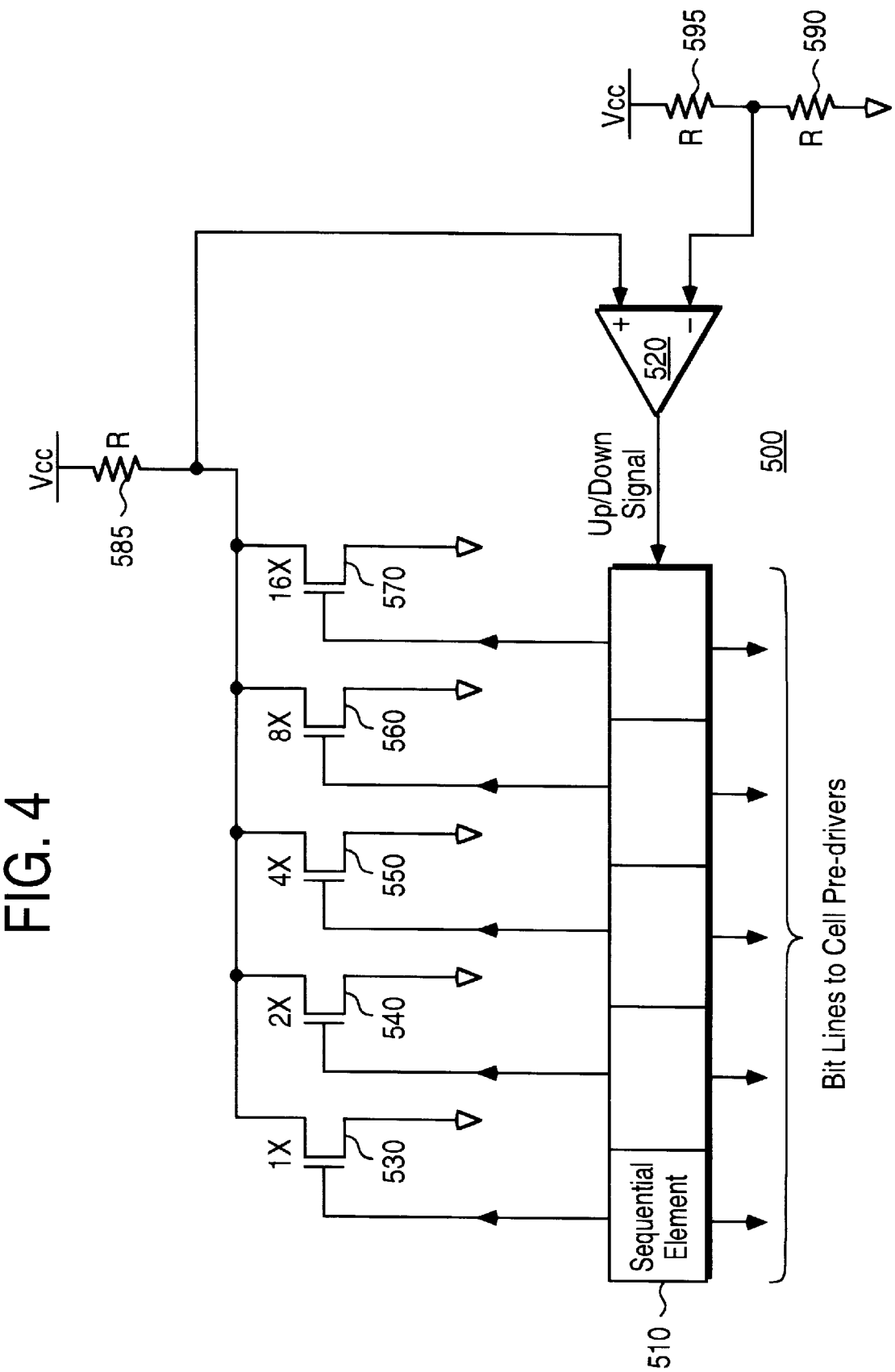
FIG. 4 is a schematic diagram illustrating an embodiment of an analog-to-digital converter circuit that may be used in or in conjunction with an embodiment of a slew rate control circuit in accordance with the invention.

A variety of techniques may be employed in order to determine the binary digital signal or signals to provide to the register. In one embodiment, the binary digital signal or signals may simply be loaded into the register from an external source. However, in an alternative embodiment, the binary digital signal or signals may be based, at least in part, on measuring the "turn on" resistance of one or more fabricated transistors. The "turn on" resistance of a transistor is directly related to the effective length of the transistor channel and, therefore, this measurement should provide information regarding whether the transistor is relatively fast or relatively slow compared to one having the target LE. This analog signal information regarding the "turn on" resistance may then be transformed to a binary digital signal or signals using an analog-to-digital converter coupled in a feedback configuration, as illustrated in FIG. 4. Although the invention is not restricted in scope to using this particular technique of measuring the "turn on" resistance of one or more fabricated transistors and then converting from an analog signal to a plurality of binary digital signals, FIG. 4 illustrates one embodiment of an analog-to-digital converter coupled in a feedback configuration to accomplish this result. This particular embodiment is illustrated as providing five bits or five binary digital signals, although again the invention is not restricted in scope in this respect.

FIG. 4 is a schematic diagram illustrating an embodiment 500 of a circuit for converting the "turn on" resistance measured for one or more transistors to a plurality of binary digital signals. As illustrated, this particular embodiment includes: a comparator 520, a five-bit counter 510, and five transistors, 530, 540, 550, 560, and 570. In this context, counter 510 also operates as a register. In this particular embodiment, the relative size of transistors 530 to 570 are binary-weighted. Comparator 520 in operation shall provide up and down digital signals to counter 510. The comparator in this feedback configuration, in equilibrium, approximately equalizes the voltage provided to the plus terminal of 520 with the voltage provided to the minus terminal of 520. Resistances 585, 590, and 595, are all equal in this embodiment and counter 510 is coupled to the respective five transistors so that when a bit for a logical one signal is stored in a respective cell of the counter, the corresponding transistor is "turned on", and so that when a bit for a logical zero signal is stored in a cell of the counter, the corresponding transistor is turned off. The circuit operates so that the "turn on" resistance of selected transistors indicated by counter 510 as being "on" in equilibrium approximately equals the resistance R. Of course, in an alternately designed circuit, the resistances need not be equal. In this embodiment, 585 comprises external precision resistor that does not vary with environmental conditions. Resistors 590 and 595 are implemented internally using two transistors that are coupled to provide Vcc/2 to 520. Thus, process variations from one transistor are offset by the other in the case. Of course, a variety of other approaches will suffice also. In this embodiment, N-channel transistors are employed; however, P-channel transistors or both N and P-channel transistors may be employed in an alternative embodiment.

The specific binary digital signals determined by this circuit and contained in counter 510 are then provided as illustrated in FIG. 1, along bit lines 151, 152, 153, 154, and 155. In this particular embodiment, the transistors of pre-driver cells 110, 120, 130, 140, and 150 are binary-weighted, as shall be described in more detail hereinafter, so that a substantially linear relationship exists between the contents of counter 510 and the effect on pre-driver 160. If the value of the bit, referred to here as the control bit, from counter 510 corresponding to a particular pre-driver cell is a logical one, the binary-weighted pre-driver turns on and provides more drive to switch the gate of the driver for the buffer, gate 0 in this example. Likewise, if the value of the control bit is logical zero, then the binary-weighted pre-driver cell corresponding to that control bit does not provide additional drive to switch the gate of the driver. It is further noted that in this particular embodiment the resistance R is chosen so that a mid-range binary value, such as 01000 by the counter, approximately corresponds a channel length of the target LE. However, if the transistors are slow, the counter should exceed 16 and if the transistors are fast, it should be below 16. Of course, the invention is not limited in scope in this respect.

A desirable aspect of this particular embodiment of a slew rate control circuit with the invention is its ease of testability. As FIG. 1 illustrates, the five binary weighted pre-driver cells are logically redundant. Thus, if one of the control lines or one of the cell transistors has a fault, this fault would be difficult, if not impossible, to detect. However, a fault may result in a buffer, for example, that is too fast or too slow. In order to provide testability, pre-driver 160 may be turned off or tri-stated, as illustrated, based on a signal provided by NAND gate 170. More specifically, "test #" is high when it is desired to test the pre-driver cells. Otherwise, when test # is low, the output signal of 170 enables the pre-driver cells. When "enable #" and "test #" of 170 are both high, pre-driver 160 is tri-stated because port "test #" of 160 is low and port "test" of 160 is high. Then, a data signal may be driven one bit at a time through the binary weighted control cells, 150 to 110. This may be accomplished by loading selected binary digital signals into counter/register 510 to test the particular or selected cell. Therefore, referring to FIG. 1, the only additional circuitry to provide this testability feature is NAND gate 170 and the control line to the cells.

Figure 2:
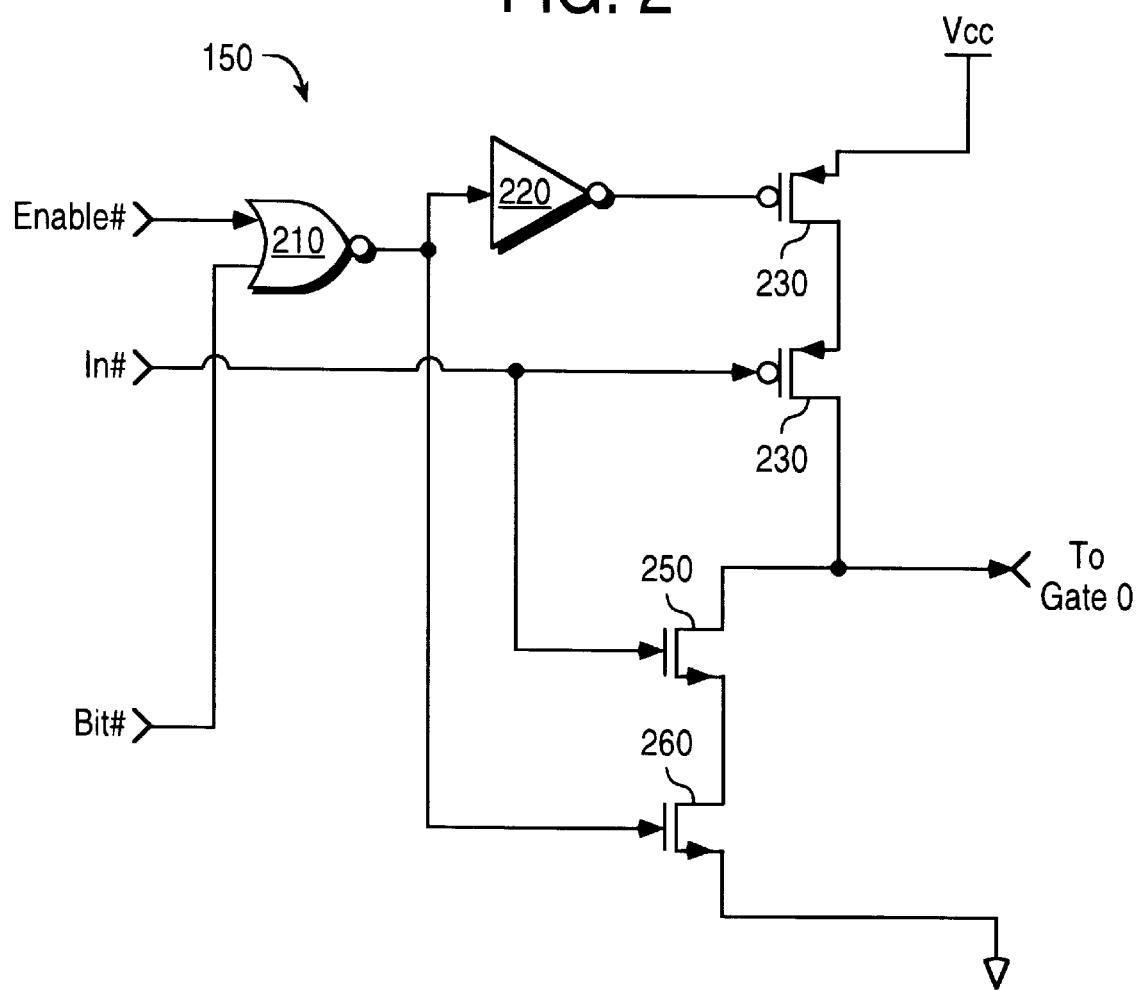
FIG. 2 is a circuit diagram illustrating a portion of the embodiment of FIG. 1.

FIG. 2 shows the internal circuitry of pre-driver cell 150 in this particular embodiment, thereby illustrating the operation of this particular embodiment of a slew rate control circuit in accordance with the present invention. As illustrated, a signal to be provided at the output port of the buffer designated "in #" is applied to transistors 240 and 250. In this particular embodiment, transistors 240 and 250 are coupled to form an inverter and the output signal of that device is provided to the gate of the buffer driver. This inverter is provided so that in this embodiment the logic of the output signal of a pre-driver cell, such as 150, corresponds with the logic of the output signal of pre-driver 160. The slew rate is affected by transistors 230 and 260 which provide additional current for pre-driver 160 when indicated based upon the signal "bit #" provided to NOR gate 210 and, thus, ultimately, inverter 220 as well. It will, of course, be appreciated that the invention is not restricted in scope to the signal conventions employed, such as the active low signals employed (designated by "#") or to the particular arrangement of logic circuitry employed, such as, for example, NOR gate 210 or NAND gate 170. These are simply implementation details that may vary depending upon the particular embodiment. Likewise, embodiments of pre-driver cells in accordance with the invention need not mimic the form of the cell illustrated in FIG. 2. Other approaches to affect the slew rate of pre-driver 160 may be employed. However, in this particular embodiment, the remaining cells are similar except that the transistors are binary-weighted in size in order to provide the appropriate amount of additional current to correspond to the binary digital signal provided to that particular pre-driver cell from counter 510.

In addition to the advantage previously described of an embodiment of a slew rate control circuit in accordance with the present invention, such as the embodiment previously described, another advantage is that the slew rate control circuit may be employed to adjust the slew rate for a digital output signal produced by a buffer, such as an output buffer, so that an integrated circuit employing such a buffer or output buffer may be employed in a variety of different circuits or circuit environments without redesigning the integrated circuit. For example, although the invention is not restricted in scope in this respect, for a processor or microprocessor embodied on an integrated circuit, a processor or microprocessor including an embodiment of a slew rate control circuit in accordance with the present invention may be employed in a variety of computer systems without redesigning the processor or microprocessor. For example, such a processor or microprocessor might be employed in a desk top system, a lap top system, a mobile system and a variety of other systems in which $T_{comin}$, and $T_{comax}$ may all be different over a particular range and likewise the slew rate may be different over a particular range. An embodiment of a slew rate control circuit in accordance with the invention may be employed to adjust or control the slew rate to meet the specifications of the particular computer system in which the processor or microprocessor is to be employed. In this embodiment, this may be accomplished by changing external precision resistor 585 to result in a different range of slew rates. Therefore, 585 may be employed to "tune" the circuit.

Figure 5:
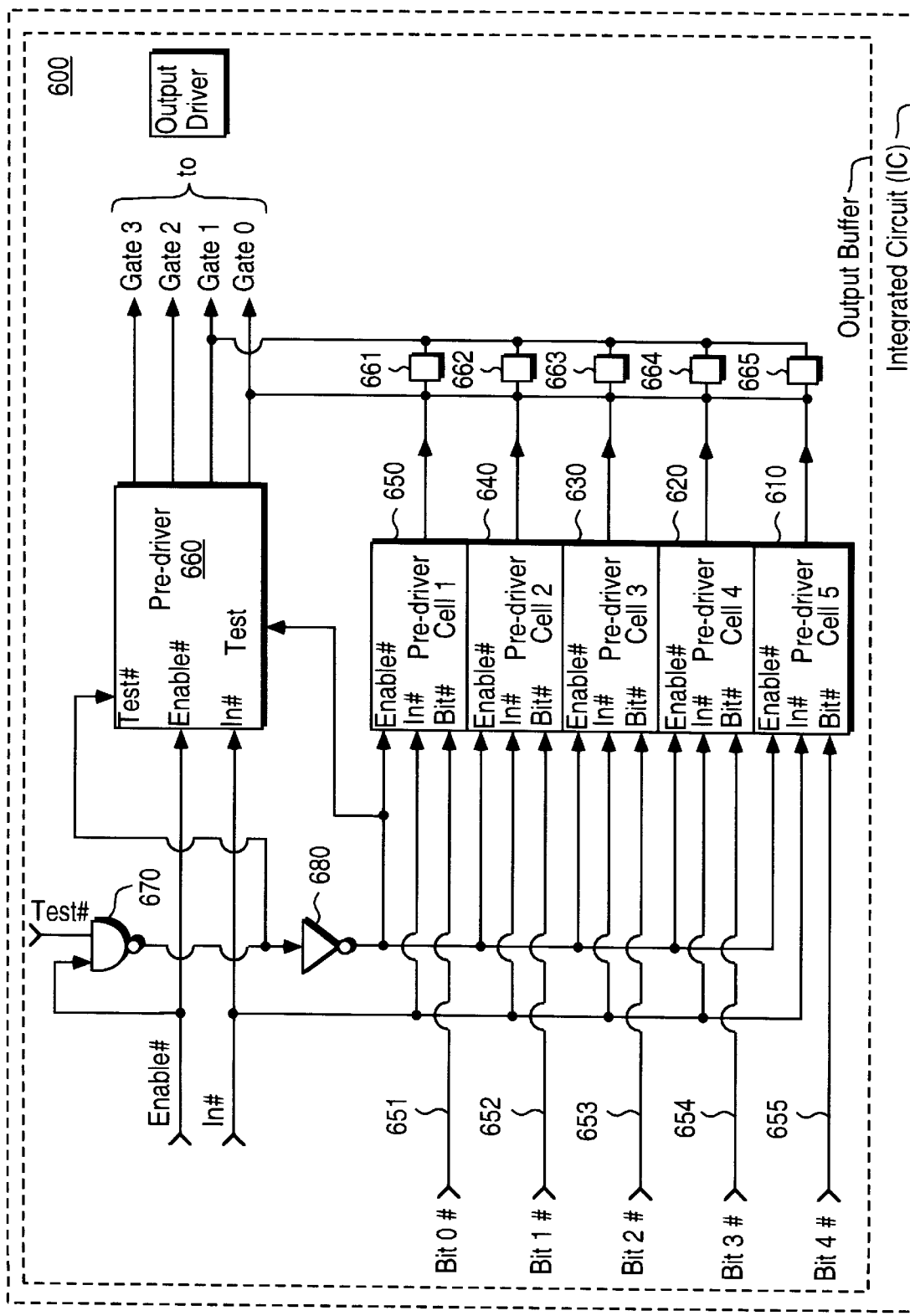
FIG. 5 is a circuit diagram illustrating an alternative embodiment of a slew rate control circuit in accordance with the invention.

FIG. 5 is a circuit diagram illustrating another alternative embodiment of a slew rate control circuit in accordance with the present invention. In embodiment 600, pre-driver 660 corresponds to pre-driver 160 of FIG. 1. Likewise, pre-driver cells 610, 620, 630, 640, and 650 correspond to driver cells 110 to 150. Bit lines 651, 652, 653, 654 and 655 correspond to bit lines 151 to 155 of FIG. 1. In addition, gates 670 and 680 correspond to gates 170 and 180 of FIG. 1. One difference between this particular embodiment and the embodiment illustrated in FIG. 1 is the inclusion of pass gates 661, 662, 663, 664 and 665. For the embodiment illustrated in FIG. 1 the output port of cells 110 to 150 are coupled to gate 0. Although the invention is not restricted in scope in this respect, in FIG. 1 gate 0 was employed because in this particular embodiment gate 0 is coupled to a majority of the transistors of the output driver, as previously described. However, in this particular embodiment, in addition to coupling the output ports of cells 610 to 650 to gate 0, these output ports are further coupled to gate 1, as illustrated in FIG. 5. However, as previously described, although the invention is not limited in scope in this respect, this particular embodiment employs GTL (or GTL+) phase control. Therefore, current will be applied to gate 1 on a different phase than the phase on which current is applied to gate 0. In order to accommodate this, pass gates 661 to 665 are introduced to provide a delay corresponding to the delay between the current being applied to gate 0 and the current being applied to gate 1. Thus, this particular embodiment provides the capability to affect the drive current for more transistors of the output driver than the embodiment illustrated in FIG. 1. In an alternative embodiment, instead of employing pass gates as illustrated in FIG. 5, another or separate set of pre-driver cells may be employed and coupled to the bit lines from, for example, counter 510 and, likewise, coupled to "enable #" and "in #" signals and the output ports of these cells may be coupled to gate 1 to provide current modification or adjustment.

An embodiment of a method of adjusting the slew rate of a digital output signal produced by a buffer in accordance with the present invention, such as may be employed by the embodiment of a slew rate control circuit in accordance with the present invention, as illustrated in FIG. 1, for example, may operate in the following manner. Current supplied to drive an output driver of the buffer may be adjusted based, at least in part, on the binary digital signal contents of a register. For example, as previously described, the contents of counter 510 may be employed to adjust the current supplied to gate 0 and, therefore, drive an output driver. For example, a binary digital signal may be loaded into counter 510, which is also a register in this context. Likewise, a measured "turn on" resistance of at least one transistor may be converted to one or more binary digital signals and contained in a register. For example, as previously described and illustrated in FIG. 5, the "turn on" resistance of at least one, and possibly more, transistors may be measured, and using an operational amplifier coupled in the feedback configuration, such as illustrated in FIG. 5, for example, this measured turn on resistance may then be converted to one or more binary digital signals and stored in counter 510, for example. As previously described, this "turn on" resistance measurement also indicates whether the channel length of the transistors deviates from a target LE and also provides an indication of the amount of deviation. This deviation from the target LE may result in a faster or slower transistor and, therefore, it is desirable to adjust the current supplied to drive the output driver in accordance with this "turn on" resistance measurement.

While certain features of the invention have been illustrated and described herein, any modifications, substitutions, changes, and equivalents, will not occur to those skilled in the art. It is, therefore, to be understood that the appended claims are intended to cover all such modifications and changes as fall within the true spirit of the invention.

We claim:

1. An integrated circuit comprising: a voltage signal slew rate control circuit for a processor comprising: a circuit configuration to produce a signal representing the speed of fabricated transistors; and a circuit configuration to adjust, based at least in part on the signal representing the speed of fabricated transistors, the amount of current produced by a pre-driver stage for an output buffer of the processor to affect the slew rate of an output voltage signal of the output buffer.

2. The integrated circuit of claim 1, wherein the signal representing the speed of fabricated transistors comprises a plurality of binary digital signals.

3. The integrated circuit of claim 2, wherein the circuit configuration to produce a signal representing the speed of fabricated transistors includes an analog-to-digital converter.

4. The integrated circuit of claim 3, wherein the analog-to-digital converter is coupled to the fabricated transistors to measure their "turn on" resistance.

5. The integrated circuit of claim 2, wherein the circuit configuration to adjust the amount of current produced by the pre-driver stage includes at least one pre-driver cell adapted to adjust, based at least in part on at least one binary digital signal of the plurality of binary digital signals, the amount of current produced by the pre-driver stage for the output buffer of the processor.

6. The integrated circuit of claim 5, wherein the pre-driver stage is adapted to supply the driver current for an output driver of the output buffer of the processor.

7. The integrated circuit of claim 5, wherein the at least one pre-driver cell includes transistors coupled to provide additional current based, at least in part, upon the signal value of the at least one binary digital signal of the plurality of binary digital signals.

8. The integrated circuit of claim 5, wherein the at least one pre-driver cell comprises more pre-driver cells than one, the more pre-driver cells including transistors, the transistors from different pre-driver cells being binary-weighted in size.

9. The integrated circuit of claim 5, wherein the slew rate control circuit includes additional circuitry to test the at least one pre-driver cell.

10. The integrated circuit of claim 9, wherein the slew rate control circuit includes additional circuitry to test the at least one pre-driver cell while disabling the pre-driver of the pre-driver stage.

11. An integrated circuit comprising:

a voltage signal slew rate control circuit for a buffer producing a voltage output signal including:
a register capable of storing at least one binary digital signal;
a pre-driver; and
at least one pre-driver cell coupled to the pre-driver;
said at least one pre-driver cell being coupled to said pre-driver and register so as to modify the amount of current produced by said pre-driver based, at least in part, on the at least one binary digital signal.

12. The integrated circuit of claim 11, and further comprising an analog-to digital converter, wherein said analog-to-digital converter includes said register, said analog-to-digital converter is coupled in a circuit configuration so as to measure the "turn on" resistance of at least one transistor and store at least one binary digital signal representing the measurement in said register.

13. The integrated circuit of claim 12, wherein the at least one pre-driver cell includes transistors coupled to provide additional current based, at least in part, upon the signal value of a binary digital signal of the at least one binary digital signal.

14. The integrated circuit of claim 13, wherein the at least one pre-driver cell comprises more pre-driver cells than one and the at least one binary digital signal comprises more binary digital signals than one, the more pre-driver cells than one including transistors, the transistors from different pre-driver cells being binary-weighted in size.

15. The integrated circuit of claim 11, and further comprising a Gunning Transceiver Logic (GTL) buffer, wherein said GTL buffer, including the capability to implement phase control, includes said slew rate control circuit;
said slew rate control circuit being coupled to operate in conjunction with the phase control of said GTL buffer.

16. The integrated circuit of claim 15, wherein said GTL buffer includes an output driver comprising a plurality of output driver transistors;
selected output driver transistors of the plurality being coupled to activate at different phases;
said at least one pre-driver cell being coupled to provide additional current to at least the selected output driver transistors at different phases.

17. The integrated circuit of claim 15, wherein said GTL buffer comprises a Gunning Transceiver Logic Plus (GTL+) buffer.

18. A method comprising:

adjusting the slew rate of a digital output voltage signal produced by a buffer comprising:
  adjusting current supplied to drive an output driver of said buffer based, at least in part, on the binary digital signal contents of a register.

19. The method of claim 18, and further comprising:

converting a measured "turn on" resistance of at least one transistor to one or more binary digital signals contained in the register.

20. The method of claim 19, wherein said output drive comprises a plurality of transistors;
  wherein adjusting current supplied comprises adjusting current supplied to selected transistors of the plurality.

21. The method of claim 19, wherein said register comprises a plurality of sequential elements;
  wherein adjusting current comprises adjusting current based, at least in part, on the signal values stored in each segmented element of the plurality.

* * * * *